United States Patent [19]

Uchida et al.

[11] Patent Number: 4,848,911

[45] Date of Patent: Jul. 18, 1989

[54] METHOD FOR ALIGNING FIRST AND SECOND OBJECTS, RELATIVE TO EACH OTHER, AND APPARATUS FOR PRACTICING THIS METHOD

[75] Inventors: Norio Uchida; Yoriyuki Ishibashi, both of Yokohama; Masayuki Masuyama, Kumagaya, all of Japan

[73] Assignees: Kabushiki Kaisha Toshiba, Kawasaki; Tokyo Kogaku Kikai Kabushiki Kaisha, Tokyo, both of Japan

[21] Appl. No.: 60,663

[22] Filed: Jun. 11, 1987

[30] Foreign Application Priority Data

Jun. 11, 1986 [JP] Japan .................................. 61-135173
Sep. 11, 1986 [JP] Japan .................................. 61-212568

[51] Int. Cl.$^4$ ................................................ G01B 9/02
[52] U.S. Cl. ...................................... 356/356; 356/363
[58] Field of Search ............... 356/355, 356, 363, 400, 356/401

[56] References Cited

U.S. PATENT DOCUMENTS 4,371,264 2/1983 Lacombut et al. .................. 356/356

FOREIGN PATENT DOCUMENTS 2120383 11/1971 Fed. Rep. of Germany .
61-116837 6/1986 Japan .

OTHER PUBLICATIONS

S. Wittekoek, SPIE, vol. 221, Semiconductor Microlithography V (1980).

Primary Examiner—Davis L. Willis
Assistant Examiner—Matthew W. Koren
Attorney, Agent, or Firm—Oblon, Fisher, Spivak, McClelland & Maier

[57] ABSTRACT

According to this invention, a method and apparatus for aligning a mask and a wafer arranged to oppose each other, in a direction along their opposing surfaces, relative to each other, are arranged as follows. A first diffraction grating as a one-dimensional diffraction grating, bars of which extend in a direction perpendicular to an alignment direction, is formed on the mask. A second diffraction grating which has a checkerboard-like pattern, is formed on the wafer. The first diffraction grating is irradiated with laser beam emitted from a light source. Light beams diffracted and transmitted through the first diffraction grating is transferred to the second diffraction grating. Light beams diffracted and reflected by said second diffraction grating are transferred to said first diffraction grating. The light beams are diffracted by and transmitted through said first diffraction grating, again. Is detected, one of the diffracted light beams, which do not propagate along a predetermined plane. The light beams reflected and diffracted by the surface of the first diffraction grating, is transferred only in the predetermined plane. For this reason, the detected diffracted light beam will not interfere with reflected diffracted light beams. The mask and wafer can be precisely aligned relative to each other, in accordance with the intensity of the detected diffracted light beam.

33 Claims, 11 Drawing Sheets

F I G. 1
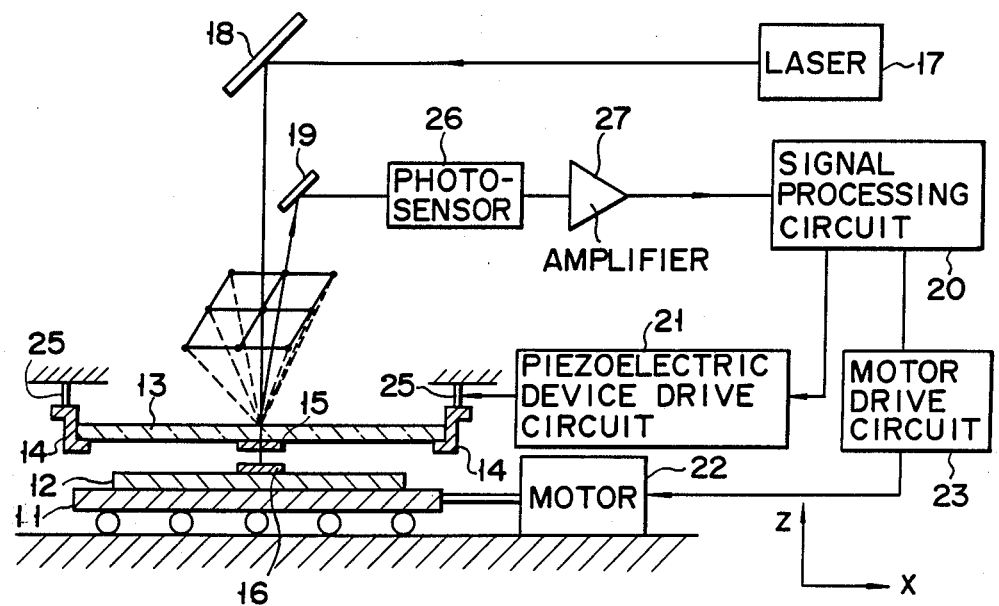
F I G. 2
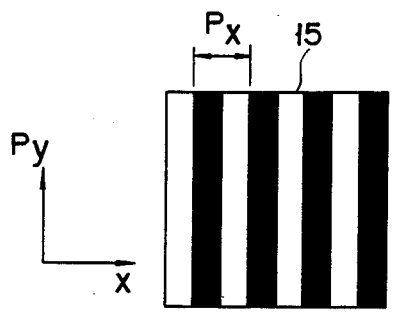
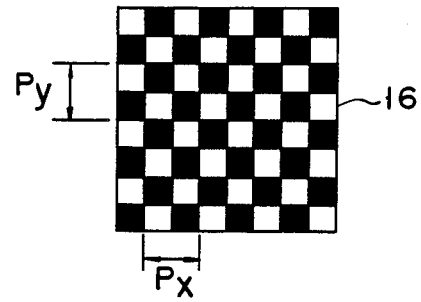

METHOD FOR ALIGNING FIRST AND SECOND OBJECTS, RELATIVE TO EACH OTHER, AND APPARATUS FOR PRACTICING THIS METHOD

BACKGROUND OF THE INVENTION

The present invention relates to a method for aligning first and second objects, relative to each other, and an apparatus for practicing this method and, more particularly, to a method and apparatus for aligning a mask and a wafer relative to each other when an image of a circuit pattern is transferred to a wafer in the steps of manufacture of a semiconductor.

In the steps of manufacturing a semiconductor device such as a VLSI, a circuit pattern is normally exposed on a wafer by an exposure apparatus. In this apparatus, when a circuit pattern preformed on a mask is irradiated with X-rays, an image of the circuit pattern is transferred to a wafer. Before the circuit pattern is transferred, the mask and the wafer must be accurately aligned relative to each other. More specifically, the mask and the wafer are arranged to face each other. However, the mask and the wafer must be aligned in a direction along opposing surfaces thereof.

One method for aligning a mask and a wafer uses a double diffraction grating. More specifically, one-dimensional diffraction gratings are respectively formed on the mask and the wafer. The two diffraction gratings have the same pitch, and their stripes (bars) are oriented in the same direction. When a laser beam is radiated onto the upper surface of the mask, light beam diffracted by and transmitted through the diffraction grating of the mask, is diffracted and reflected by the diffraction grating of the wafer, and is again diffracted by the diffraction grating of the mask. Diffracted light beams of +1st and 1st orders of these diffracted light beams, are detected. The relative position between the mask and the wafer is adjusted, so that intensities $In(+1)$ and $In(-1)$ of these diffracted light beams are equal to each other. Thus, the mask and the wafer are aligned relative to each other.

However, the diffraction grating of the mask also serves as a reflection type diffraction grating. For this reason, the diffracted light beams of the $\pm 1$st orders which are diffracted along the path of mask→wafer→mask, interfere with reflected diffracted light beams of the $\pm 1$st order reflected by the upper surface of the mask. If a distance of a gap between the mask and the wafer is z, the diffracted light beams of the $\pm 1$st orders have an optical path difference of $2z$ with respect to the reflected diffracted light beam of the 1st order. If $2z = n\lambda$, ($\lambda$ is a wavelength of incident light beam and n is an integer), the diffracted light beams of the $\pm 1$st orders are interfered with the reflected diffracted light beam of the $\pm 1$st order. For this reason, if a gap between the mask and the wafer varies by $\lambda/4$, the intensity of the $\pm 1$st order diffracted light beam is considerably decreased, and measurement of the $\pm 1$st order diffracted light beam is difficult to attain.

Therefore, if the distance of the gap between the mask and the wafer cannot be accurately maintained, the measurement precision of the relative displacement between the mask and the wafer is impaired.

Japanese Patent Disclosure No. 61-116837 describes the following alignment method.

Angle $\theta_k$ of diffraction of the kth order is given by:

$$\sin\theta_k = k\cdot\lambda/p \quad (1)$$

(where p is a pitch of the diffraction gratings) For this reason, if the pitch of the diffraction grating of the mask is $p_m$ and the pitch of the wafer is $p_w$, $2p_m = p_w$ is established. The angle of diffraction of diffracted light beam of the 1st order reflected by the diffraction grating of the mask, thus, differs from that of the diffracted light beam of the $\pm 1$st orders diffracted along the path of mask→wafer→mask.

However, the method described in the disclosure also reported that the intensity of the diffracted light beam of the $\pm 1$st orders depends on the distance of the gap between a mask and a wafer (High Precision Alignment Method Using Double Diffraction Gratings (No. 5), Seimitsukikai Gakkai Shukitaikai Gakujitsukoen Ronbunshu, 1984, pp. 443–444, NTT Tsuken). If the distance of the gap between the mask and the wafer cannot be maintained within 2 $\mu$m, it is difficult to measure the diffracted light beam of the $\pm 1$st orders. For this reason, the alignment precision between the mask and the wafer is impaired.

SUMMARY OF THE INVENTION

It is an object of the present invention to provide a method for precisely aligning first and second objects, relative to each other, and an apparatus for practicing this method.

It is another object of the present invention to provide a method and an apparatus for precisely aligning a mask and a wafer, relative to each other, irrespective of a distance of a gap between the mask and the wafer.

The method and apparatus for aligning first and second objects arranged to face each other in a direction along their surfaces, relative to each other, are arranged as follows:

A first one-dimensional diffraction grating, the stripes (bars) of which extend in a first direction perpendicular to an alignment direction, is formed on a first object. A second diffraction grating, which has a checkerboard-like pattern is formed on a second object. The first direction is perpendicular to a first plane, to which a second plane inclines at a predetermined angle ($\alpha$), said second plane being symmetrical to a third plane with respect to said first plane. Laser beam is radiated from a light source onto the first diffraction grating. The light beam has an optical axis present in the second plane. The light beam is diffracted and transmitted through the first diffraction grating, and a first diffracted light beams are emerged from said first diffraction grating. The first diffracted light beams are transferred to the second diffraction grating, so that the first diffracted light beams are diffracted and reflected by the second diffraction grating, and a second diffracted light beams are emerged from the second diffraction grating. The second diffracted light beams are transferred to the first diffraction grating, so that the second diffracted light beams are diffracted and transmitted through the first diffraction grating, and a third light diffracted light beams are emerged from said first diffraction grating. Some of the third diffracted light beams are transferred in the third plane, and the other third diffraction light beams are transferred in any planes other than the third plane. One of the other third diffracted light beams is detected. In accordance with the intensity of the detected diffracted light beam, the relative displacement between the first and second objects is adjusted, and the first and second objects are aligned relative to each other.

The first diffraction grating is a one-dimensional diffraction grating, and the second diffraction grating is a diffraction grating having a checkerboard-like pattern. The first and second diffraction gratings serve as double diffraction gratings. For this reason, diffracted light beam which is diffracted along a path of first diffraction grating→ second diffraction grating→ first diffraction grating, appears as a two-dimensional pattern. On the other hand, the reflected diffracted light beams reflected by the surface of the first diffraction grating, are reflected only by the third plane. In this invention, one of the third diffracted light beams in any planes other than the third plane, can be detected. For this reason, the detected and diffracted light beam will not interfere with reflected and diffracted light beam. According to theoretical analysis of the present invention, the relative displacement between the first and second objects can be adjusted irrespective of the distance of the gap between the first and second objects. For this reason, the first and second objects can be precisely aligned relative to each other.

The present invention can be applied to a method and apparatus for aligning a mask and a wafer relative to each other, in an exposure apparatus. Therefore, the first object can be a mask and the second object can be a wafer.

BRIEF DESCRIPTION OF THE DRAWINGS

FIG. 1 is a diagram schematically illustrating an apparatus for aligning a mask and a wafer, relative to each other, according to a first embodiment of the present invention;

FIG. 2 is a plan view showing first and second diffraction gratings respectively formed on the mask and the wafer in the apparatus shown in FIG. 1;

DETAILED DESCRIPTION FO THE PREFERRED EMBODIMENTS

Figure 3:
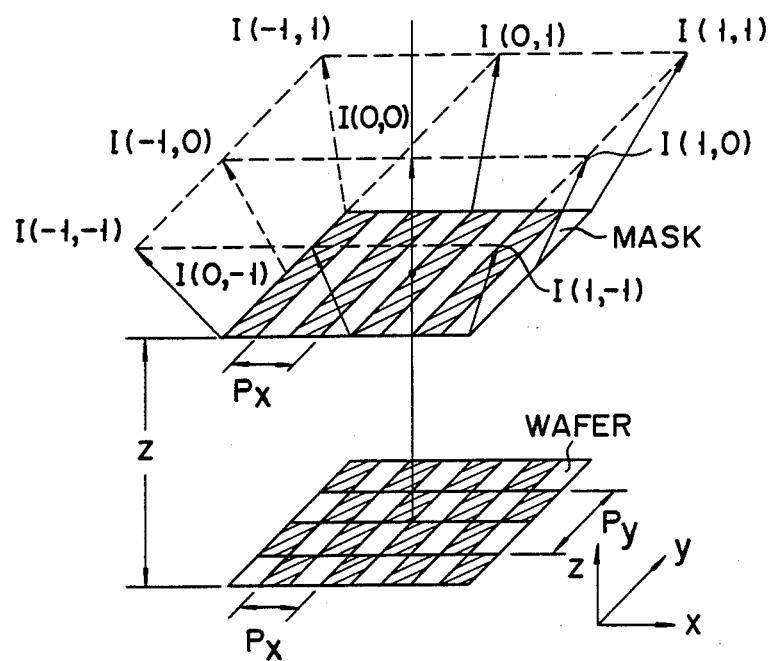
FIG. 3 is a perspective view showing patterns of the light beams diffracted by the diffraction gratings of the mask and the wafer, respectively.

As shown in FIG. 1, an apparatus for aligning a mask and a wafer relative to each other, has wafer table 11 which is movable in the x direction. Wafer table 11 is connected to motor 22. When motor 22 is driven, wafer table 11 is moved in an alignment direction (x direction). Wafer 12 is placed on the upper surface of wafer table 11. Mask 13 is arranged above wafer 12. Mask 13 and wafer 12 are separated at a predetermined distance in the z direction. Mask 13 is supported by holder 14. Holder 14 is supported by piezo-electric device 25. When piezo-electric device 25 is driven, mask 13 is moved in the z direction.

Transmission type first diffraction grating 15 is formed on mask 13, as shown in FIG. 2. Reflection type diffraction grating 16 is formed on the upper surface of wafer 12. First and second diffraction gratings 15 and 16 are arranged to face each other. First diffraction grating 15 is a one-dimensional diffraction grating, the stripes (bars) of which extend in the y direction. First diffraction grating 15 has grating pitch $p_x$ in the x direction. Second diffraction grating 16 is a checkerboard-patterned diffraction grating. Second diffraction grating 16 has grating pitch $p_x$ in the x direction and grating pitch $p_y$ in the y direction. More specifically, the pitch in the x direction of first diffraction grating 15 is equal to that of second diffraction grating 16 in the x direction.

The apparatus also comprises laser 17 for emitting coherent laser beam, photosensor 26 for detecting diffracted light beams to convert it into an electrical signal, signal processing circuit 20 for processing the electrical signal to produce a control signal, and motor drive circuit 23 for supplying a current to motor 22 in accordance with the control signal.

The mask and the wafer are aligned by the apparatus, relative to each other, in the following manner.

Light beam emitted from laser 17 is radiated onto mirror 18. The light beam reflected by mirror 18 is radiated onto first diffraction grating 15. The light beams which are diffracted by and transmitted through diffraction grating 15, are transferred to second diffraction grating 16. The light beams which are diffracted and reflected by diffraction grating 16, are transferred to first diffraction grating 15. The light beams which are diffracted by and transmitted through diffraction grating 15, are transferred to mirror 19. In this manner, first and second diffraction gratings serve as double diffraction gratings. One of the light beams diffracted by diffraction gratings 15 and 16, i.e., light beams in a specific direction, are guided to photosensor 26. More specifically, an inclination angle of mirror 19 is adjusted, so that the diffracted light beam guided to photosensor 26 is picked up. The diffracted light beam in the specific direction is converted to an electrical signal corresponding to the intensity of the diffracted light beam by photosensor 26. The electrical signal is supplied to signal processing circuit 20 through amplifier 27 and is processed by processing circuit 20. Processing circuit 20 produces a motor drive signal. The motor drive signal is suppled to motor drive circuit 23. Drive circuit 23 supplies a current to motor 22 based on this signal. Then, motor 22 is driven, and wafer 12 is moved in the x direction with respect to mask 13. Thus, the relative displacement between mask 13 and wafer 12 is adjusted, so that they are aligned relative to each other.

When laser beam is diffracted along the path of first diffraction grating 15→ second diffraction grating 16→ first diffraction grating 15, first and second diffraction gratings 15 and 16 serve as the double diffraction gratings, as described above. For this reason, diffracted light beams of the 0th and 1st orders appear in nine directions, as shown in FIG. 3.

The laser beam may be reflected by the surface of first diffraction grating 15. Reflected and diffracted light beams of the 1st order reflected by first diffraction grating 15, are transferred in a plane perpendicular to the stripes (bars) of diffraction grating 15 and including the optical axis of incident light beam. More specifically, the reflected and diffracted light of beams the 1st order are transferred in a plane including the x axis and the z axis if the optical axis of incident light is given as the z axis. In contrast to this, the diffracted light beams of 0th and 1st orders, appear in nine directions, as described above. According to the present invention, diffracted light beams of the 0th and ±1st orders which do not propagate along the plane including the x and z axes, are detected. For this reason, the detected light beams of the 0th and ±1st orders will not interfere with light beams reflected by the mask surface.

According to the present invention, the intensity of diffracted light beam is independent of the distance of a gap between the mask and the wafer. The reason therefor will be described below.

Before the description, the principle of diffraction when laser beams are diffracted by diffraction gratings 15 and 16, will be described.

Figure 5:
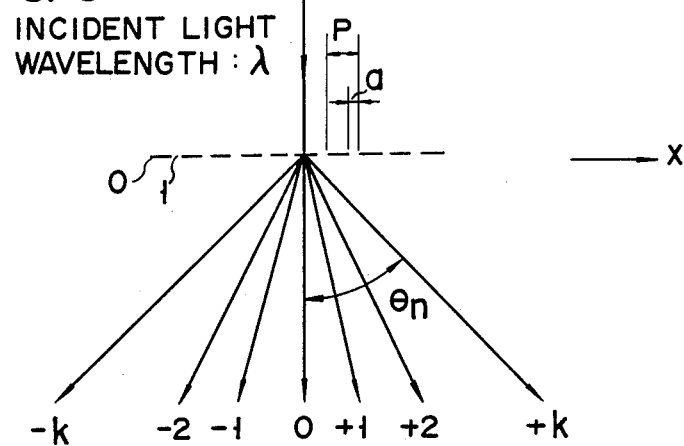
FIG. 5 shows the principle of diffraction according to the present invention, and shows a pattern of the light beam diffracted by a one-dimensional diffraction grating.

Coherent light beam of wavelength $\lambda$ is radiated onto diffraction grating perpendicularly. It has pitch p and light transmission width a. FIG. 5 shows a diffraction pattern of the light beam diffracted by this diffraction grating. Angle $\theta_k$ of diffraction of the diffracted light component of the +kth order is expressed by:

$$\sin\theta_k = k \cdot \lambda / p \quad (2)$$

Complex amplitude $C_k$ of the diffracted light beam of the kth order is a coefficient of the complex transmission function of diffraction grating, which the complex transmission function is expanded to a Fourier series, as periodic function. Complex amplitude $C_k$ of the diffracted light beam of the kth order is given by:

$$C_k = (1/p) \int_{-p/2}^{p/2} A(x) \cdot \exp\{-i(2\pi k/p)x\} dx \quad (3)$$

If complex transmission function A(x) of the grating given as follows is substituted for equation (3):

$$A(x) = \begin{cases} 0 & (-p/2 \leq x < -a/2) \\ 1 & (-a/2 \leq x < a/2) \\ 0 & (a/2 \leq x < p/2) \end{cases} \quad (4)$$

complex amplitude $C_k$ of the diffracted light component of the kth order is expressed by:

$$C_k = \{\sin(ak\pi/p)\}/k\pi \quad (5)$$

Figure 6:
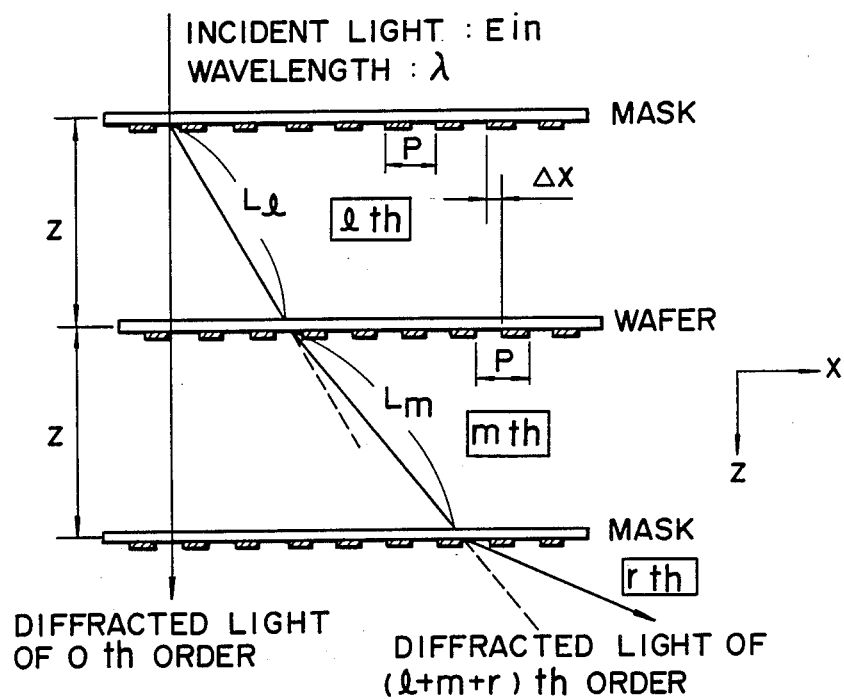
FIG. 6 shows the principle of diffraction according to the present invention and illustrates an optical model equivalent to an optical model when incident light beam is diffracted in the order of the first diffraction grating of the mask, the second diffraction grating of the wafer, and the first diffraction grating of the mask.
Figure 7:
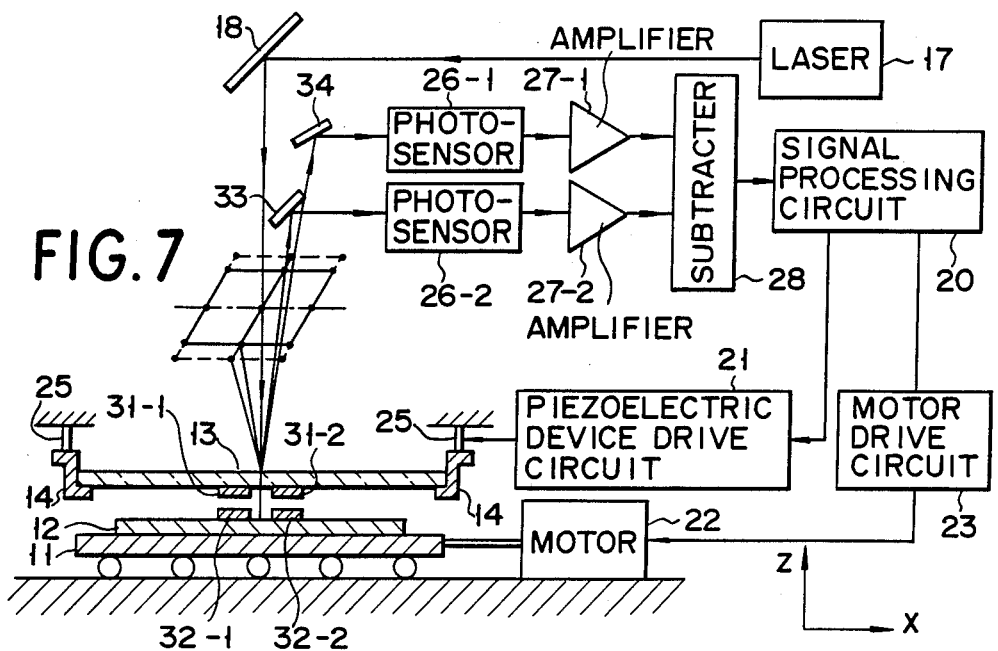
FIG. 7 is a diagram showing an apparatus for aligning a mask and a wafer, relative to each other, according to a second embodiment of the present invention.

A case will be explained wherein a mask and a wafer respectively having one-dimensional diffraction gratings are arranged to face each other through a gap of a predetermined distance. In this case, the diffraction grating of the mask serves as a transmission type diffraction grating, and the diffraction grating of the wafer serves as a reflection type diffraction grating. The optical model in this case is equivalent to an optical model shown in FIG. 6. When light is diffracted by the mask to be the lth order, by the wafer to be the mth order, and by the mask to be the rth order, the transmission light beams of mask→wafer→mask becomes diffracted light beams of the (l+m+r)th orders. The complex amplitude of the diffracted light beams is given by $C_l \cdot C_m \cdot C_r$. The diffracted light beam is out of phase by $$\phi x = \frac{2\pi}{\lambda} \cdot \left\{ 2Z - \frac{Z}{2} \cdot \frac{l^2 + (l+m)^2}{p^2} \cdot \lambda^2 \right\}$$

relative to the incident light beam immediately before the incidence onto the mask.

When the wafer is displaced with respect to the mask by $\Delta x$, the complex amplitude of light beams diffracted by the wafer is expressed using equation (3) as follows:

$$C'_m = (1/p) \int_{-p/2}^{p/2} A(x)\exp\{-i(2\pi m/p)(x + \Delta x)\} dx \quad (6)$$

Equation (6) can be rewritten as:

$$\begin{aligned} C'_m &= \exp\{-i(2\pi m/p)\Delta x\} \cdot \\ &\quad (1/p) \int_{-p/2}^{p/2} A(x)\exp\{-i(2\pi m/p)x\} dx \\ &= \exp\{-i(2\pi m/p)\Delta x\} \cdot C_m \end{aligned} \quad (7)$$

Transmission diffracted light beams U(l+m+r) of the (l+m+r)th orders are expressed by following equation (8) as incident light Ein:

$$U(l + m + r) \quad (8)$$
$$= C_l \cdot C'm \cdot C_r \cdot \exp[-i\phi x] \cdot E\text{in}$$
$$= C_l \cdot Cm \cdot C_r \cdot \exp[-i\phi x + \{(2\pi/p)m\Delta x\}] \cdot E\text{in}$$

For example, diffracted light beams of the 0th order in the x direction are represented by a combination of all the diffracted light beams satisfying $l+m+r=0$.

A case will be described wherein a one-dimensional diffraction grating is formed on a mask, and a checkerboard-like diffraction grating is formed on a wafer, as shown in FIG. 3. In this case, light beams are two-dimensionally diffracted by the wafer. If the order of diffraction in the x direction is the mth order, the order of diffraction in the y direction is the nth order, a pitch of diffraction grating of the mask in the x diffraction is given as $p_x$, a pitch of diffraction grating of the wafer in the y direction is given as $p_y$, the transmission width of light in the x direction of the diffraction grating of the mask, is given as $a_x$, and the transmission width of the light beams in the y direction of the diffraction grating of the wafer, is given as $a_y$, the complex amplitude of the light beam diffracted by the wafer is given by the following equation:

$$C_{mn} = 1/(mn\pi^2) \cdot \sin\{(a_x/p_x)m\pi\} \cdot \sin\{(a_y/p_y)n\pi\} \cdot \quad (9)$$
$$[1 + \cos\{(m + n)\pi\}]$$

In equation (9), if $a_x/p_x = a_y/p_y = 1/2$, $C_{mn}$ is:
$$C_{mn} = 1/(mn\pi^2) \cdot \sin(m\pi/2) \cdot \sin(n\pi/2) \cdot \quad (10)$$
$$[1 + \cos\{(m + n)\pi\}]$$

Therefore, transmission diffracted light beam $U(l+m+r, n)$ diffracted via mask-wafer-mask is expressed by:

$$U(l + m + r, n) \quad (11)$$
$$= C_r \cdot C_{mn} \cdot C_l \cdot \exp[-i\{\phi xy + (2\pi/p_x)m\Delta x\} \cdot E\text{in}$$

In the equation (10), $\phi xy$ is a dephasing amount relative to the incident light beam immediately before the incidence onto the mask, and is given as follows:

$$\phi_{xy} = \frac{2\pi}{\lambda}\left[2z - \frac{Z}{2}\left(\frac{l^2 + (l+m)^2}{P_x^2} + \frac{n^2}{P_y^2}\right)\lambda^2\right]$$

As an example of this diffracted light beam, intensity $I(0,1)$ of the 0th order in the x direction and the 1st order in the y direction can be obtained as follows. In this case, a combination yielding $l+m+r=0$, $n=1$ can be taken into consideration. However, the influence of a combination of diffracted light components of higher orders on complex amplitude is small. Therefore, a combination of diffracted light components of the 0th to 1st orders is taken into consideration. The following four combinations can be considered using $\{l, (m, n), r\}$:

$\{0, (1, 1), -1\}$ $\{0, (-1, 1), 1\}$ $\{-1, (1, 1), 0\}$ $\{1, (-1, 1), 0\}$

If $Z=\pi\lambda z/p_x^2$ and $X=(2\pi/p_x)\cdot\Delta x$, from equation (11) the equation of the light beam can be rewritten as:

$$U(0, 1)=2(1/\pi)^3\cdot\exp(-iZ)\cdot\{\exp(-iX)+\exp(iX)\}\cdot E\text{in} \quad (12)$$

Intensity $I(0, 1)$ of light is:

$$I(0, 1) = |U(0, 1)|^2 \quad (13)$$

When the intensity of incident light is $I_0$, light beam intensity $I(0, 1)$ is:

$$I(0, 1) = 8(1/\pi)^6 \cdot \{1 + \cos 2X\} \cdot I_0 \quad (14)$$

As can be understood from this equation, intensity $I(0, 1)$ of diffracted light beam is a function including only $\Delta x$ in relative displacement between the mask and wafer, as the variable. For this reason, the light intensity does not depend on the distance of a gap between the mask and the wafer.

Figure 4:
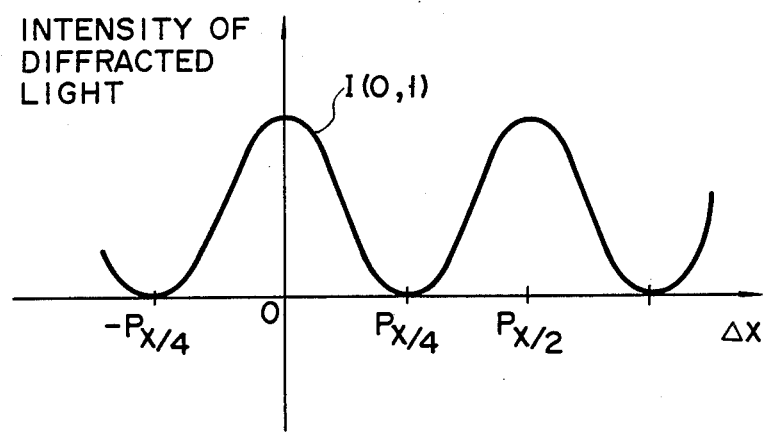
FIG. 4 is a graph showing the relationship between the intensity of diffracted light beams and a shift in position between the mask and the wafer, detected by the apparatus according to the first embodiment of the present invention.

FIG. 4 illustrates the relationship between $\Delta x$ in relative displacement between the mask and the wafer and the light intensity when intensity $I(0, 1)$ of diffracted light beams is to be detected. The intensity of diffracted light beams is expressed by a periodic function of $p_x/2$. If the wafer is moved relative to the mask, so that the intensity of diffracted light beams is set to be the peak value of the periodic function, the mask and the wafer can be aligned relative to each other.

According to the method of the present invention, diffracted light beams which do not propagate along a plane perpendicular to the stripes of the diffraction grating of the mask and including the optical axis of incident light, are detected. For this reason, light beams reflected by the diffraction grating of the mask will not interfere with the detected diffracted light beams. As can be apparent from equation (14), the intensity of diffracted light beams does not depend on the distance of the gap. For this reason, the mask and the wafer can be precisely aligned relative to each other irrespective of the distance of the gap.

A second embodiment of the present invention will be described with reference to FIGS. 7 to 10.

Figure 8:
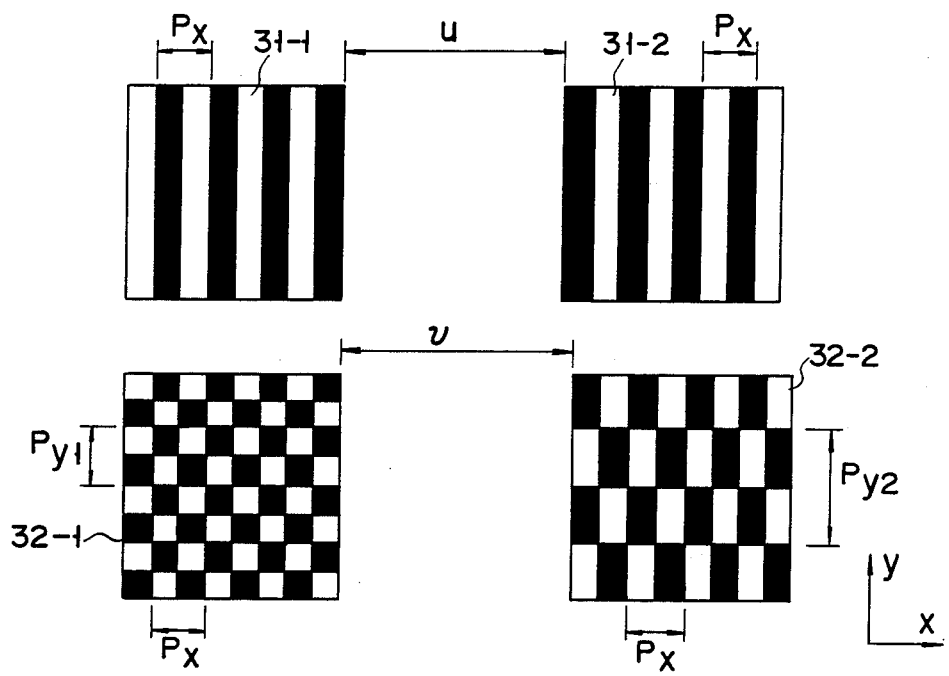
FIG. 8 is a plan view showing two sets of first and second diffraction gratings used in the apparatus shown in FIG. 7.

In this embodiment, two sets of first and second diffraction gratings are arranged on mask 13 and wafer 12, respectively. More specifically, two first diffraction gratings 31-1 and 31-2 are formed on mask 13, and two second diffraction gratings 32-1 and 32-2 are formed on wafer 12. As shown in FIG. 8, each of first diffraction gratings 31-1 and 31-2 is a one-dimensional diffracting grating having grating pitch $p_x$ in the x direction. First diffraction grating 31-1 and 31-2 are arranged to be separated at distance u from each other. Second diffraction gratings 32-1 and 32-2 are checkerboard-like patterned diffraction gratings, and have grating pitches $p_{y1}$ and $p_{y2}$ in the y direction, respectively. Second diffraction gratings 32-1 and 32-2 are arranged to be separated at distance from each other. The relationship between u and v is expressed by:

$$u = v + \frac{2N + 1}{4} \cdot P_x$$

N is an integer.

Two second diffraction gratings 32-1 and 32-2 of the wafer have different grating pitches in the y direction. Even if light beams diffracted by two second diffraction gratings 32-1 and 32-2, have the same order of diffraction, they have different angles of diffraction at two second diffraction gratings 32-1 and 32-2. For this reason, diffracted light beams diffracted by one set of first and second diffraction gratings 31-1 and 32-1 and diffracted light beams diffracted by the other set of first and second diffraction gratings 31-2 and 32-2, appear in the different direction. Therefore, two diffracted light beams must be independently detected.

For this purpose, a pair of photosensors 26-1 and 26-2 for independently detecting two diffracted light beams and subtractor 28, are arranged in an alignment apparatus for this embodiment. Two diffracted light beams are independently converted to electrical signals by photosensors 26-1 and 26-2. These electrical signals are supplied to subtractor 28 through amplifiers 27-1 and 27-2, respectively. Subtractor 28 calculates the difference between the intensities of the two diffracted light beams. The difference of the electrical signals is supplied to signal processing circuit 20. In the same manner as in the first embodiment, a motor drive signal is produced from signal processing circuit 20, and a current is supplied to motor 22 based on this signal. Then, wafer 12 is moved relative to mask 13 in the x direction. Thus, the relative displacement between mask 13 and wafer 12 is adjusted, and they can be aligned relative to each other.

In the case of diffracted light beams of the (0,1)th orders, if the intensities of two diffracted light beams are $I_1(0,1)$ and $I_2(0,1)$, subtractor 28 calculates the following equation:

$$\Delta I = I_1(0,1) - I_2(0,1) \tag{15}$$

Figure 9:
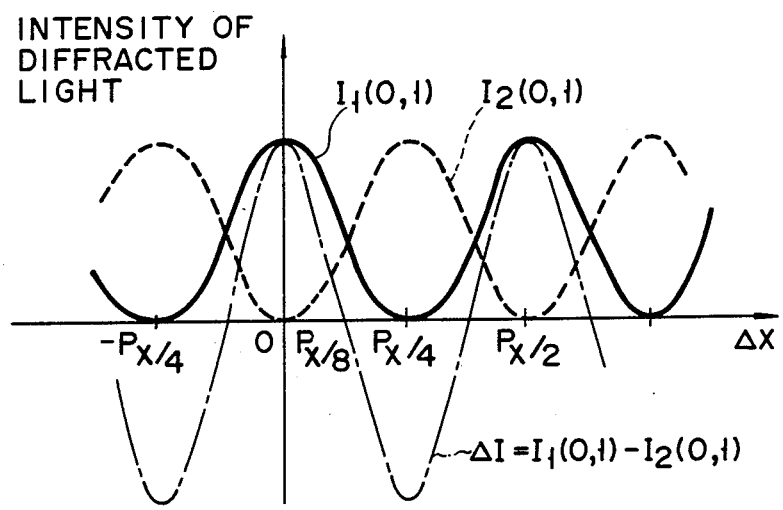
FIGS. 9 and 10 are graphs showing the relationship between the intensity of diffracted light beams and a relative displacement between the mask and the wafer, detected by the apparatus shown in FIG. 7.
Figure 10:
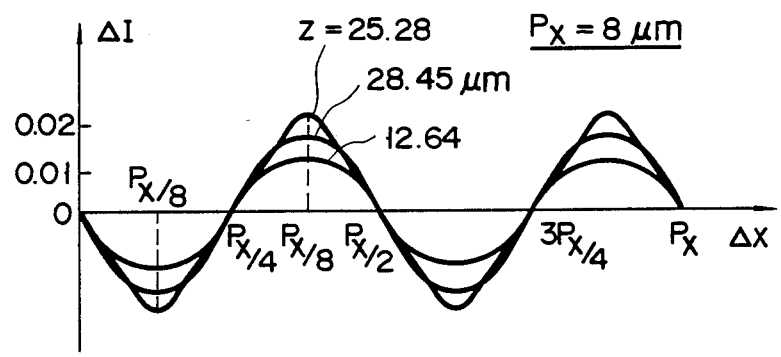

FIG. 9 shows the relationship between difference $\Delta I$ between the intensities of diffracted light components and $\Delta x$ in relative displacement. For example, in case $N=0$, two sets of diffraction gratings are shifted from each other by $p_x/8$ in the x direction. The phases of $I_1(0,1)$ indicated by the full curve and $I_2(0,1)$ indicated by the broken curve are shifted by $p_x/4$. When equation (15) is calculated, $\Delta I$ is expressed by the periodic function having a period of $p_x/4$. This is indicated by the alternate long and short dashed curve in FIG. 9. Each time the relative displacement between mask 13 and wafer 12 is shifted by $p_x/4$, $\Delta x$ in relative displacement is zero-point detected. Thus, the relative displacement between the mask and the wafer can be precisely aligned. FIG. 10 shows difference $\Delta I$ in intensities of the diffracted light beams when diffracted light beams of a still higher order are taken into consideration based on equation (14). In this case, $\Delta x$ in relative displacement can be zero-point detected irrespective of the distance of the gap near the zero-crossing point. For this reason, even when the diffracted light beams of the higher order are taken into consideration, the mask and the wafer can be precisely aligned relative to each other.

Figure 11:
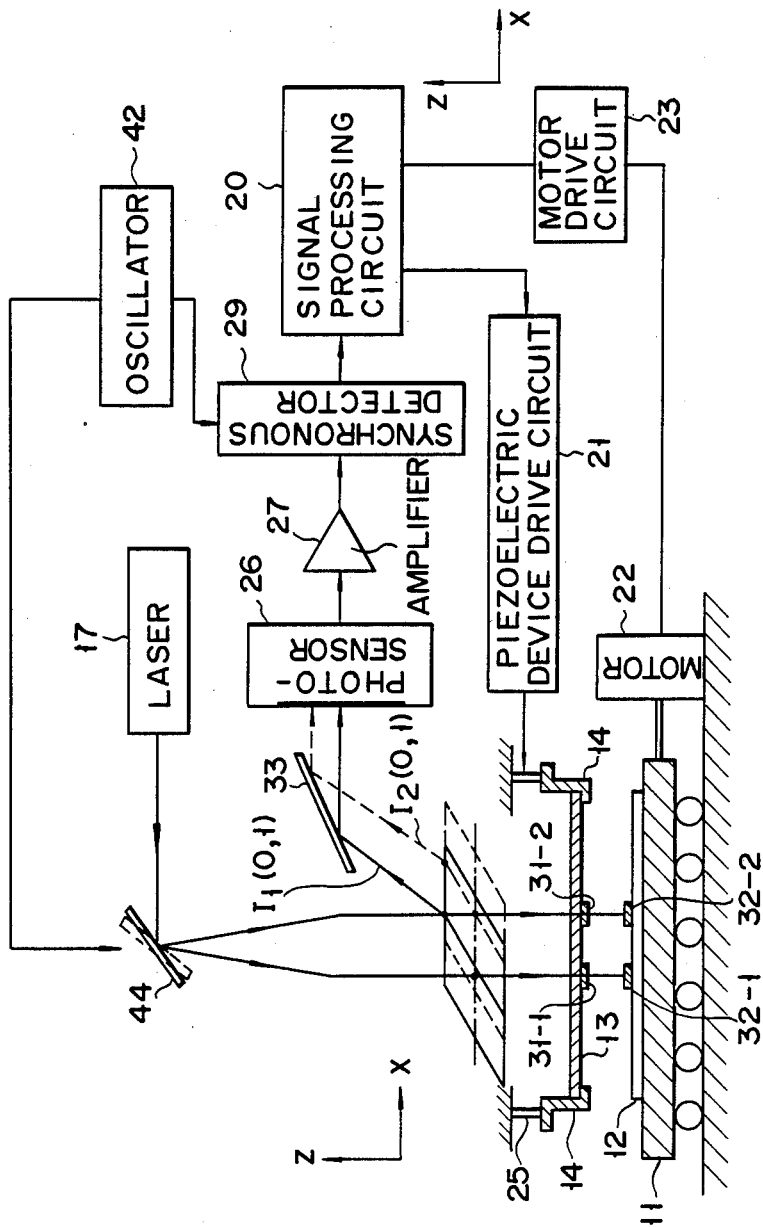
FIG. 11 is a diagram showing an apparatus for aligning a mask and a wafer, relative to each other, according to the modification of the second embodiment of the present invention.
Figure 12A:
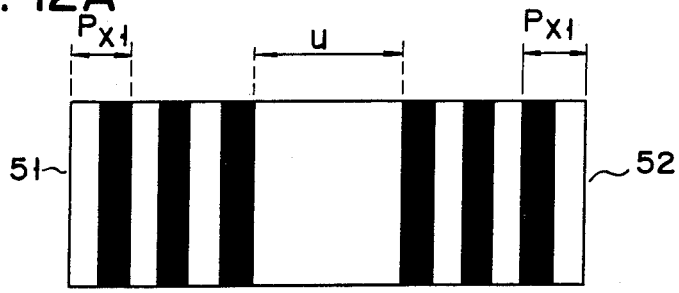
FIGS. 12A, 12B, 12C, and 12D are plan views showing diffraction gratings in a preamble of a third embodiment of the present invention.
Figure 12B:
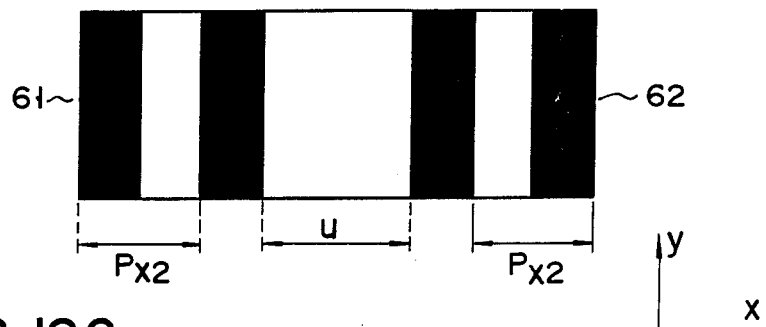
Figure 12C:
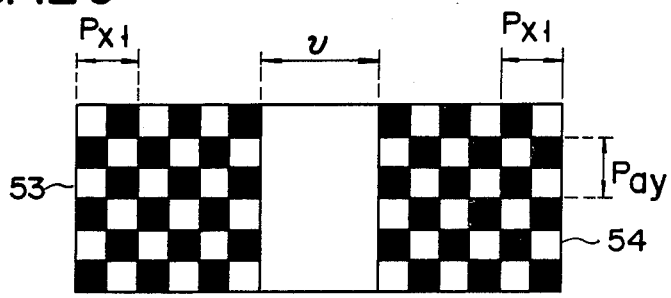
Figure 12D:
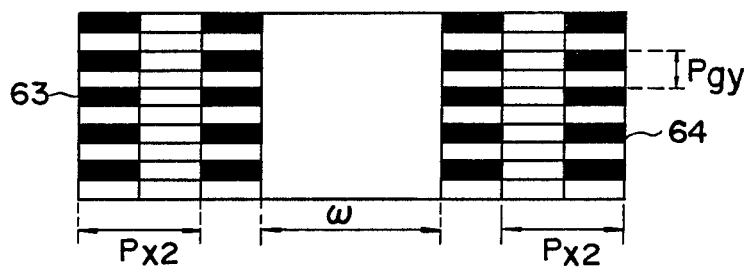

The modification of the second embodiment will be described below. In this modification, as shown in FIG. 11, two light beams diffracted by two sets of first and second diffraction gratings are synchronously detected in order to calculate the difference between intensities of diffracted light beams. First diffraction gratings 31-1 and 31-2 are formed on the mask to be separated at a same distance in the case shown in FIG. 8. Second diffraction gratings are also formed on the wafer to be separated at the distance v in the same manner as above, and grating pitches $p_{y1}$ and $P_{y2}$ in the y direction is equal to each other.

In order to synchronously detect two diffracted light beams, oscillator 42, oscillation mirror 41, and synchronous detector 29 are arranged. Oscillator 42 generates a reference signal at a predetermined frequency. The reference signal is supplied to oscillation mirror 41 and synchronous detector 29, respectively. Oscillation mirror 41 is thus oscillated at the predetermined frequency. Laser beams are alternately guided in two directions for each predetermined period of time, and are incident on two sets of diffraction gratings. Two light beams diffracted on two sets of diffraction gratings are alternately incident on photosensor 26, through mirror 33, and are converted to two electrical signals. The two electrical signals are alternately supplied to synchronous detector 29 for each predetermined period of time through amplifier 27. Synchronous detector 29 synchronously detects the two electrical signals based on the reference signal at the predetermined frequency. Thus, the difference of the intensities of the two diffracted light beams can be detected, respectively. In this manner, the relative position between mask 13 and wafer 12 can be adjusted in the same manner as in the second embodiment.

In the first and second embodiments, the intensity of diffracted light beams to be detected, can be not only $I(0,1)$ but also $I(0,-1)$. In other words, diffracted light beams to be detected, can be one that does not propagate along a plane perpendicular to the stripes of the first diffraction grating and including the optical axis of incident light beam. For example, the following intensities can be calculated:

$$\Delta I = I_1(0,-1) - I_2(0,-1)$$

$$\Delta I = I_1(0,1) - I_1(0,-1)$$

$$\Delta I = I_1(0,-1) - I_2(0,1)$$

If laser beams can be obliquely radiated with respect to the y direction, the detection optical system (e.g. mirror) will not cross exposure light beam on exposing a circuit pattern advantageously.

A third embodiment of the present invention will now be described. In this embodiment, not only a mask and a wafer are aligned relative to each other, but also a gap therebetween is set to be a predetermined distance.

The United States Patent Application filed by the inventors on the same date (corresponding to applications for claiming priority: Japanese Patent Application Nos. 135172/86, 212566/86, 284586/86 and 78701/87) disclosed a method for setting a distance between a mask and a wafer to be a predetermined distance.

With this setting method and the alignment method disclosed in the present invention, the relative displacement between a mask and a wafer is aligned, and at the same time a gap therebetween can be set to a predetermined distance. More specifically, as shown in FIGS. 12A to 12D, first alignment marks 51 and 52 comprising first diffraction gratings, are printed on a mask to be separated at distance u from each other. Gap measurement marks 61 and 62 comprising one-dimensional diffraction gratings, are printed on a wafer to be separated at distance u from each other. Second alignment marks 53 and 54 comprising checkerboard-patterned diffraction gratings, are printed on the wafer to be separated by distance v from each other. Second gap measurement marks 63 and 64 comprising two-dimensional diffraction gratings, are printed on the wafer to be separated by distance w from each other.

The mask and the wafer are aligned relative to each other using the first and second alignment marks. The gap between the mask and the wafer is set to a predetermined distance using the first and second gap measurement marks. At this time, the grating pitch of alignment marks 51, 52, 53, and 54 in the x direction is different from that of gap measurement marks 61, 62, 63, and 64.

However, in order to align the mask and the wafer and also set a gap therebetween to a predetermined value, alignment marks and gap measurement marks must be formed respectively on the mask and the wafer. In particular, when a plurality of types of marks are formed on the mask, the precision of this mark is often degraded. As a result, precisions for alignment and gap setting may be degraded.

For this reason, in the third embodiment, in order to align the mask and the wafer and to set the distance of a gap therebetween to be a predetermined distance, one type of mark is formed on the mask.

Figure 13A:
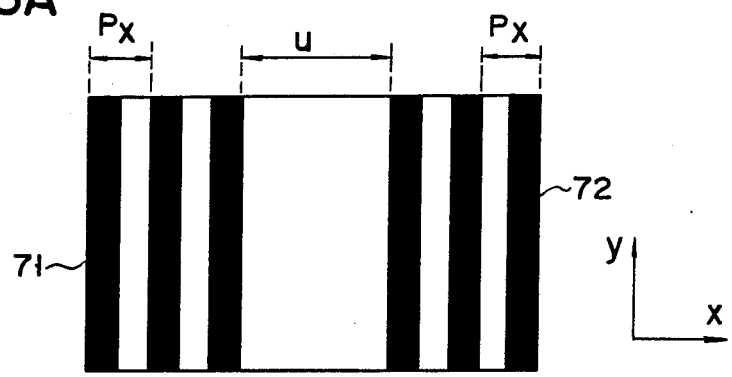
FIGS. 13A, 13B, and 13C are plan views showing diffraction gratings in the third embodiment of the present invention.

As shown in FIG. 13A, marks 71 and 72, each of which comprises a one-dimensional diffraction grating having pitch $p_x$ in the x direction, are formed on the mask. These marks 71 and 72 are formed to be separated by distance u from each other. Marks 71 and 72 serve as both alignment and gap setting marks.

Figure 13B:
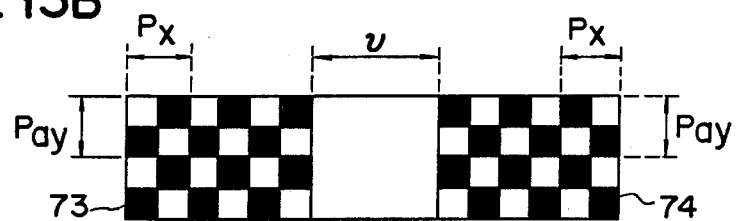
Figure 13C:
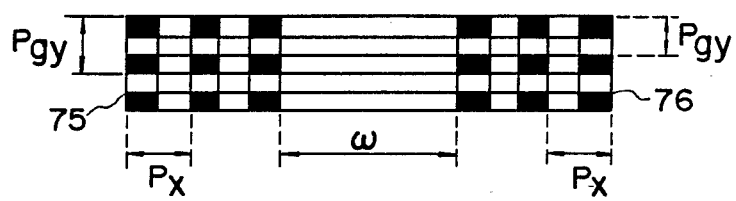

As shown in FIGS. 13B and 13C, alignment marks 73 and 74 comprising checkerboard-patterned diffraction gratings, are formed on the wafer. Checkerboard-patterned diffraction gratings or marks 73 and 74 have pitch $p_x$ in the x direction, and pitch $p_{ay}$ in the y direction. Two-dimensional gap measurement diffraction gratings or gap measurement marks 75 and 76, are also formed on the wafer. Marks 75 and 76 have pitch $p_x$ in the x direction, and pitch $p_{gy}$ in the y direction. More specifically, marks 71 to 76 have the same pitch $p_x$ in the x direction. Alignment marks 73 and 74 and gap measurement marks 75 and 76 have different pitches in the y direction. Alignment marks 73 and 74 are formed to be separated by distance v, and gap measurement marks 75 and 76 are formed to be separated by distance w. The relationship between distances v and w is as follows:

$$u = v + \{(2N+1)/4\} \cdot p_x$$

$$w = u + \{(2N+1)/2\} \cdot p_x$$

where N is an arbitrary integer.

Figure 14:
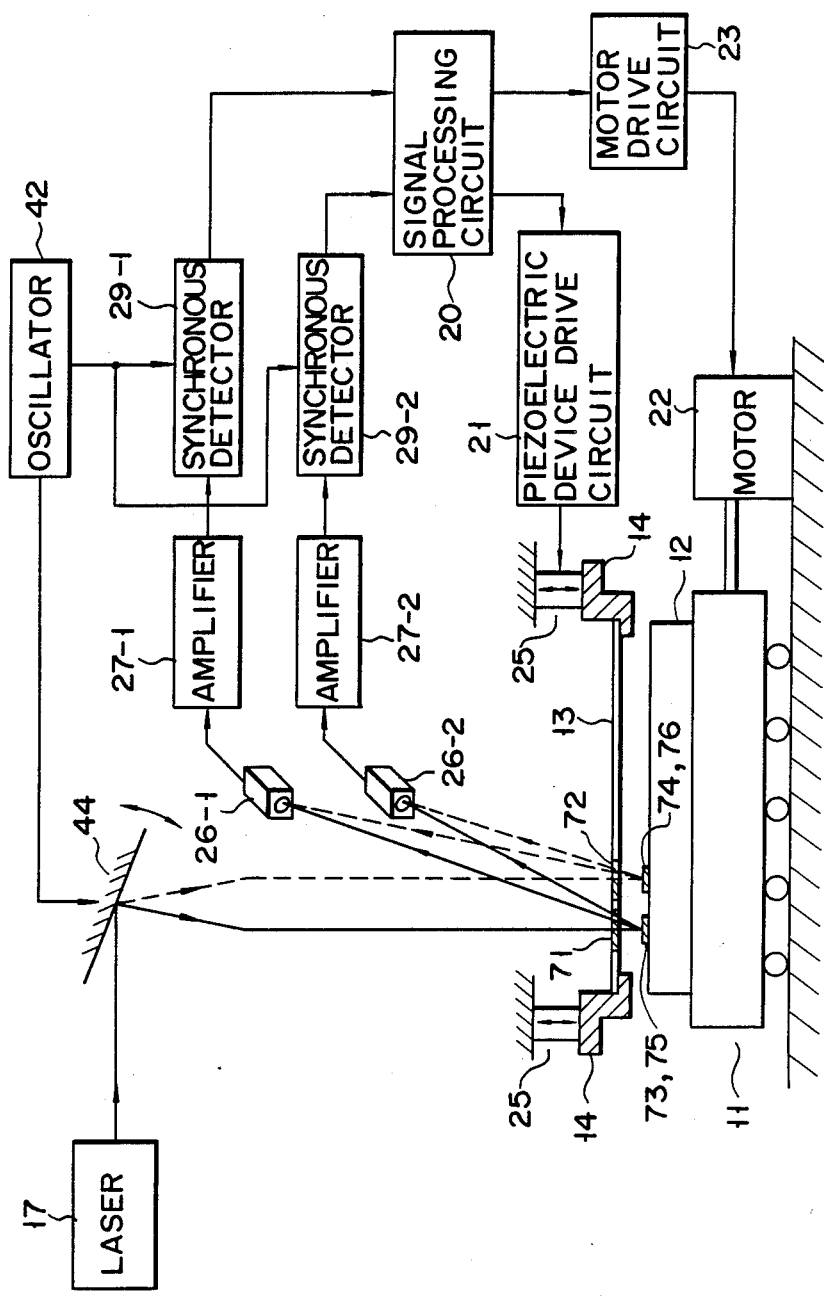
FIG. 14 is a diagram showing an apparatus for aligning a mask and a wafer, relative to each other, according to the third embodiment of the present invention.

The mask and the wafer are aligned and a gap therebetween is set at the same time, using the apparatus shown in FIG. 14. This apparatus is substantially the same as the apparatus for synchronously detecting the intensities of diffracted light beams shown in FIG. 11.

More specifically, mask 13 is supported by mask holder 14. Holder 14 is supported by piezo-electric device 25. When a current is supplied from piezo-electric device drive circuit 21 to piezo-electric device 25, mask 13 is moved in the vertical direction (z direction). On the other hand, wafer 12 is placed on wafer table 11. Wafer table 11 is coupled to motor 22. When a current is supplied from motor drive circuit 23 to motor 22, wafer table 11 is moved in an alignment direction (x direction).

Laser beams emitted from laser 17 are radiated onto oscillation mirror 44. The beams reflected by mirror 44 are radiated onto marks 71 and 72 on mask 13. At this time, oscillator 42 generates a reference signal at a predetermined frequency. The reference signal is supplied to oscillation mirror 44 and synchronous detectors 29-1 and 29-2. When the beams are reflected by oscillation mirror 44, the light beam are deflected in synchronism with the reference signal. Therefore, marks 71 and 72 are alternately irradiated with laser beam for each predetermined period of time.

The beams passing through marks 71 and 72 are diffracted and reflected by marks 73 to 76 of the wafer. The diffracted light beams are transferred to marks 71 and 72 and is then diffracted thereby. The diffracted light beams of the (0,1)th orders are incident on photosensors 26-1 and 26-2.

The pitch in the y direction of alignment diffraction gratings 73 and 74 is different from that of gap measurement diffraction gratings 75 and 76. For this reason, appear in different directions, two first diffracted light beams, or alignment light beams which are diffracted along a path of mark 71→mark 73→mark 71, and are diffracted along a path of mark 72→mark 74→mark 72, and two second diffracted light beams, or gap measurement diffracted light beams which are diffracted along a path of mark 71→mark 75→mark 71, and are diffracted along a path of mark 72→mark 76→mark 72. The grating pitch in the y direction of alignment diffraction grating 73 is equal to that of diffraction grating 74. Therefore, appear in the same direction, two first diffracted light beams which are diffracted along a path of mark 71→mark 73→mark 71, and are diffracted along a path of mark 72→mark 74→mark 72. Similarly, the grating pitch in the y direction of gap measurement diffraction grating 75 is equal to that of diffraction grating 76. Therefore, appear in the same direction, two second diffracted light beams which are diffracted along a path of mark 71→mark 75→mark 71, and are diffracted along a path of mark 72 mark 76→mark 72. As a result, the two first diffracted light beams are detected by photosensor 26-1 and the two second diffracted light beams are detected by photosensor 26-2.

Two first diffracted light beams of the (0,1)th orders detected by photosensor 26-1 are converted to an electrical signal in the same manner as in the modification of the second embodiment, and this electrical signal is synchronously detected. Based on this detection result, motor drive circuit 23 supplies a current to motor 22. Thus, motor 22 is driven, and the relative displacement between the mask and the wafer is adjusted.

Similarly, two second diffracted light beams of the (0,1)th orders are converted to an electrical signal, and the electrical signal is synchronously detected. Based on the detection result, piezo-electric device drive circuit 21 supplies a current to piezo-electric device 25. Thus, piezo-electric device 25 is driven, and the distance of the gap between the mask and the wafer is adjusted.

Figure 15A:
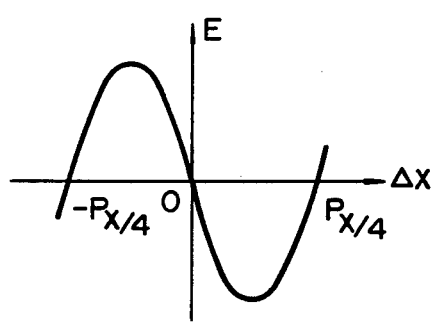
FIG. 15A is a graph showing the relationship between the intensity of diffracted light beams and a relative displacement between the mask and the wafer, detected by the apparatus shown in FIG. 14.
Figure 15B:
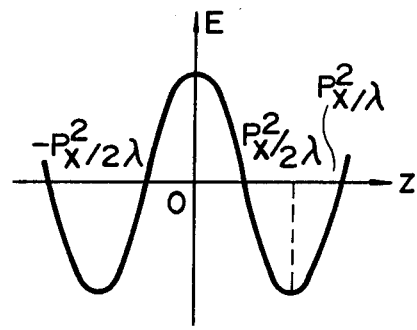
FIG. 15B is a graph showing the relationship between the intensity of diffracted light beams and a distance of a gap between the mask and the wafer, detected by the apparatus shown in FIG. 14.

FIGS. 15A and 15B show detection results of intensities of the first diffracted light beams of the (0,1)th orders and the second diffracted light beams of the (0,1)th orders. More specifically, as shown in FIG. 15A, a detection signal representing in relative displacement detected by the first diffracted light beams is given by:

$$\sin 2(2\pi \Delta x / p_x)$$

If $\Delta x$ in relative displacement is 0, $\pm p_x/4$, the detection output become 0. If $\Delta x$ in relative displacement is $\pm p_x/8$, the detection output exhibits a peak value.

As shown in FIG. 15B, a detection signal of a gap detected by the second diffracted light beams is expressed by:

$$\cos\{(\pi\lambda/p_x^2)\cdot z\}$$

(where λ is a wavelength of light). If gap z is 0, $P_x^2/\lambda$, the detection output exhibits a peak value. If gap z is $P_x^2/2\lambda$, the detection output becomes zero.

Therefore, since the one type of mark is formed on the mask, the mark and the wafer are aligned relative to each other, and at the same time, the gap is set to a predetermined distance. Two types of marks, need not be formed on a mask, unlike in a conventional method.

Figure 16A:
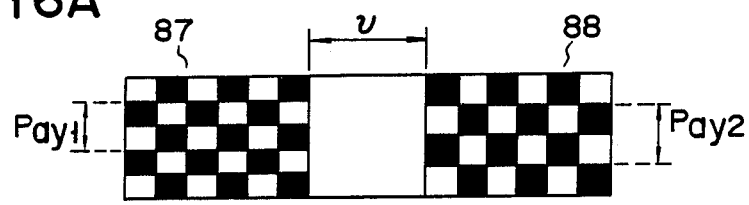
FIGS. 16A and 16B are plan views showing diffraction gratings according to the modification of the third embodiment of the present invention.
Figure 16B:
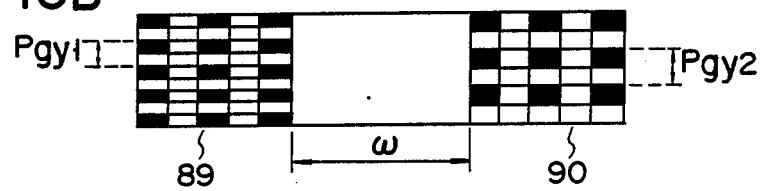
Figure 17:
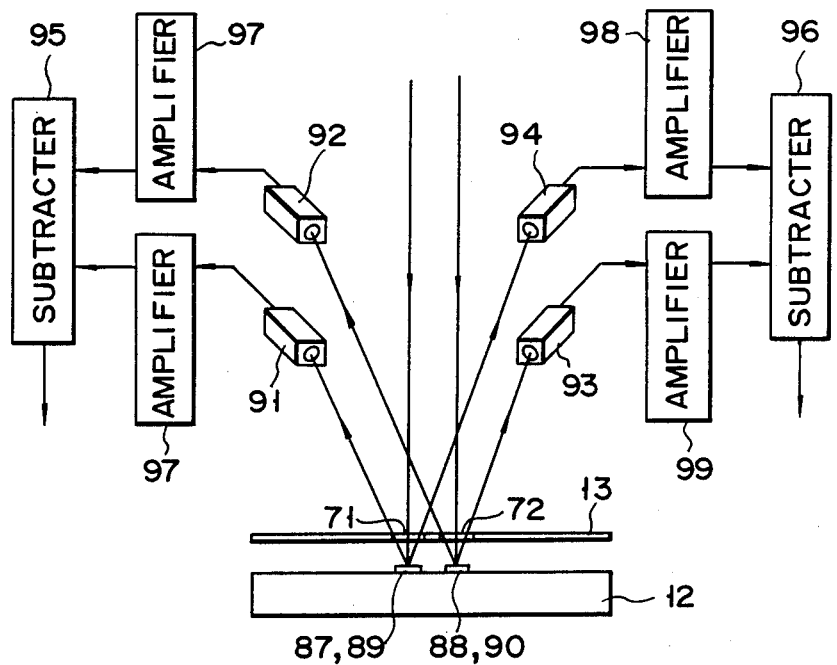
FIG. 17 is a diagram showing an apparatus for aligning a mask and a wafer, relative to each other, based on the modification of the third embodiment of the present invention.

FIGS. 16A, 16B and 17 show a modification of the third embodiment. In this modification, the grating pitches in the y direction of alignment marks 87 and 88 formed on the wafer are different from each other. In addition, the grating pitches in the y direction of gap measurement marks 89 and 90 are different from each other. For this reason, appear in different direction, two first diffracted light beams which are diffracted along a path of mark 71→mark 87→mark 71, and are diffracted along a path of mark 72→mark 88→mark 72. Similarly, appear in different direction, two second diffracted light beams which are diffracted along a path of mark 71→mark 89→mark 71, and are diffracted along a path of mark 72→mark 90→mark 72. For this reason, as shown in FIG. 17, these diffracted light beams are detected by four photosensors 91 and 94. Two first diffracted light beams detected by photosensors 91 and 92 are converted to two electrical signals. The difference between the two electrical signals is calculated by subtractor 95. As shown in FIG. 15A, a detection signal of Δx in relative displacement can be obtained. Two second diffracted light beams are similarly processed and a detection signal of gap z is detected, as shown in FIG. 15B. Thus, the relative displacement between the mask and the wafer is aligned relative to each other, and at the same time, the gap is set to be a predetermined distance.

Gap measurement mark may be a one-dimensional diffraction grating whose bars are perpendicular to the bars of mark 71, 72.

A fifth embodiment of the present invention will now be described. In the above-mentioned four embodiments, the incident light beam is perpendicular to mask 13. However, the incident light beam need not always be perpendicular to mask 13. In the fifth embodiment, a case will be described wherein a light beam is obliquely incident on mask 13.

Figure 18:
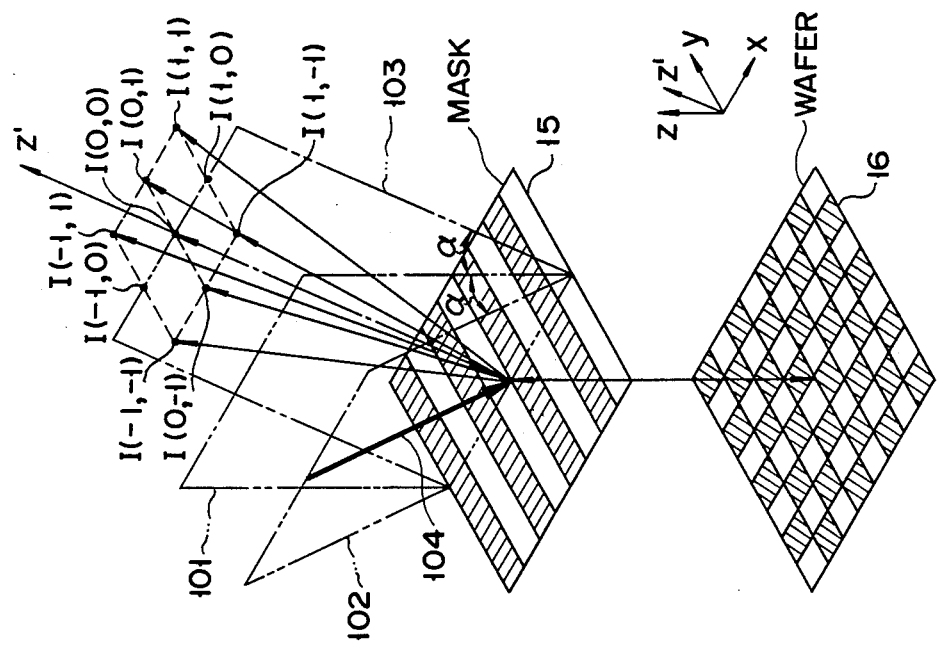
FIG. 18 is a perspective view, according to a fifth embodiment of the present invention.

As shown in FIG. 18, first diffraction grating 15 formed on mask 13 and second diffraction grating 16 formed on wafer 12 are arranged in the same manner as in the case shown in FIG. 3. As shown in FIG. 18, a plane perpendicular to the bars direction of first diffraction grating 15 is defined as first plane 101. A plane obtained by inclining first plane 101 in the bars direction at a predetermined angle (α°) is defined as second plane 102. A plane symmetrical to the second plane with respect to first plane 101 is defined as third plane 103. Light beam emitted from laser 17 is incident on first diffraction grating 15. An optical axis 104 of the incident light beam is present in the second plane 102. A smaller number of incident light beam is reflected and diffracted by the surface of grating 15. The reflected and diffracted light beams are transferred along only third plane 103.

Most of incident light beam is diffracted by and transmitted through first diffraction grating 15, and are transferred to second diffraction grating 16. The light beams diffracted and reflected by second diffraction grating 16, are transferred to first diffraction grating 15. The light beams are diffracted by and transmitted through first diffraction grating 15. The diffracted light beam which is diffracted along a path of first diffraction grating second diffraction grating first diffraction grating, appears as a two-dimensional pattern. The diffraction pattern is the same manner as in the case wherein the light beam is incident perpendicularly on grating 15.

As is shown in FIG. 23, an origin I(0,0) of the pattern is given as a point on a line (z′) symmetrical to the optical axis 104 of the incident light beam with respect to the first plane, i.e., to line (z′) is present on the third plane 103. On the other hand, if the incident light beam is perpendicular to grating 15 (i.e., α=0, z′=z), the origin I(0,0) is present on the incident light beam.

Some of the diffracted light beams are transferred to third plane 103, and other diffracted light beams are transferred in any planes other than third plane 103. Some of the diffracted light beams are light beams of, e.g., I(0,0)th and I(−1, 0)th orders, and other diffraction light beams are light beams of, e.g., I(0,±1)th and I(±1,±1)th orders.

Accordingly, some of the diffracted light beams interfere with the light beams reflected and diffracted by the surface of first diffraction grating 15, but other diffracted light beams do not interfere with the reflected light beams. Thus, one of other diffracted beams is detected. More specifically, a light beam of I(0,±1)th or I(±1,±1)th order is detected. The detection result is substantially the same as the detection result shown in FIGS. 4. Therefore, when the light beam is obliquely incident on grating 15, a gap can be accurately adjusted in the same manner as in a case wherein the light beam is incident perpendicularly on grating 15.

What is claimed is:

1. A method for aligning first and second objects, arranged to oppose each other, in a direction along their opposing surfaces, relative to each other, comprising the steps of:

arranging a first one-dimensional diffraction grating on said first object, the first diffraction grating having parallel bars extending in a first direction perpendicular to the alignment direction, the first direction being perpendicular to a first plane, to which a second plane inclines at a predetermined angle (α), said second plane being symmetrical to a third plane with respect to said first plane;

arranging a second diffraction grating on said second object, the second diffraction grating having a checkerboard pattern;

irradiating said first diffraction grating with light beam emitted from a light source, the light beam having an optical axis present in the second plane, so that the light beam is diffracted and transmitted through the first diffraction grating, and first diffracted light beams are emerged from said first diffraction grating;

transferring the first diffracted light beams to said second diffraction grating, so that the first diffracted light beams are diffracted and reflected by the second diffraction grating, and second diffracted light beams are emerged from said second diffraction grating;

transferring the second diffracted light beams to said first diffraction grating, so that the second diffracted light beams are diffracted and transmitted through the first diffraction grating, third diffracted light beams are emerged from said first diffraction grating, some of the third diffracted light beams are transferred in the third plane, and the other third diffracted light beams are transferred in any planes other than the third plane;

detecting one of the other third diffracted light beams; and adjusting a relative displacement between said first and second objects in accordance with an intensity of the detected diffracted light beam.

2. The method according to claim 1, wherein said first object is a mask and said second object is a wafer.

3. The method according to claim 1, wherein the angle ($\alpha$) at which said first plane inclines to said second plane is 0°.

4. The method according to claim 1, wherein if the alignment direction is given as an x direction, the first direction is given as a y direction, a point on a line symmetrical to the optical axis of the incident light beam with respect to the first plane is given as an origin and in the step of detecting diffracted light beam, one of the (0, ±1)th orders light beams of the other third diffracted light beams is picked up.

5. The method according to claim 1, wherein two sets of said first and second diffraction gratings are arranged on the first and second objects, respectively.

6. The method according to claim 5, wherein if a distance between said first diffraction gratings is given as u, a distance between said two second diffraction gratings is given as v, and a pitch in an x direction of said first and second diffraction gratings is given as px, and N is an arbitrary integer, u and v can be defined as:

$$u = v + \{(2N+1)/4\} \cdot p_x$$

in the step of detecting the diffracted light beam, one of the other third diffracted light beams diffracted by one set of said first and second diffraction gratings, and one of the other third diffracted light beams diffracted by the other set of said first and second diffraction gratings, are picked up, and a difference between intensities of these two diffracted light beams is calculated, whereby the relative displacement between said first and second objects is adjusted based on the difference between intensities.

7. The method according to claim 6, wherein the grating pitches in the y direction of said two second diffraction gratings are different from each other, and in the step of detecting the diffracted light beam, when one of the other third diffracted light beams diffracted by one set of said first and second diffraction gratings, and the same order one of the other third diffracted light beams diffracted by the other set of said first and second diffraction gratings appear in different directions, these diffracted light beams are separately picked up.

8. The method according to claim 5, wherein the light beam emitted from said light source is alternately radiated onto said two sets of first and second diffraction gratings for each predetermined period of time, and in the step of detecting the diffracted light beam, one of the other third diffracted light beams diffracted by one set of said first and second diffraction gratings, and one of the other third diffracted light beams diffracted by the other set of said first diffraction gratings are alternately picked up for each predetermined period of time, and a difference between intensities of the two diffracted light beams is calculated, whereby the relative displacement between said first and second objects is adjusted based on the difference between intensities.

9. The method for aligning first and second objects, arranged to oppose each other, in a direction along their opposing surfaces, relative to each other, and at the same time, setting a gap between said first and second objects to a predetermined distance, comprising the steps of:

arranging a mark having a one-dimensional diffraction grating, on said first object, the diffraction grating having parallel bars extending in a first direction perpendicular to the alignment direction, the first direction being perpendicular to a first plane, to which a second plane inclines at a predetermined angle ($\alpha$), said second plane being symmetrical to a third plane with respect to said first plane;

arranging an alignment mark having a diffraction grating on said second object, the diffraction grating having a checkerboard-like pattern;

arranging a gap measurement mark having a diffraction grating on said second object, the diffraction grating having at least one set of parallel bars extending in the alignment direction;

irradiating said mark with light beam emitted from a light source, the light beam having an optical axis present in the second plane, so that the light beam is diffracted and transmitted through said mark, and first diffracted light beams and fourth diffracted light beams are emerged from said mark;

transferring the first diffracted light beams to the alignment mark, so that the first diffracted light beams are diffracted and reflected by the alignment mark, and second mark;

transferring the fourth diffracted light beams to the gap measurement mark, so that the fourth beams to the gap measurement mark, so that the fourth diffracted light beams are diffracted and reflected by the gap measurement mark, and fifth diffracted light beams are emerged from said gap measurement mark;

transferring the second diffracted light beams to said mark, so that the second diffracted light beams are diffracted and transmitted through said mark, third light diffracted beams are emerged from said mark, some of the third plane, and the other third diffracted light beams are transferred in any planes other than the third plane;

transferring the fifth diffracted light beams to said mark, so that the fifth diffracted light beams are diffracted and transmitted through said mark, sixth light diffracted beams are emerged from said mark, some of the sixth diffracted light beams are transferred in the third plane, and the other sixth diffracted light beams are transferred in any planes other than the third planes;

detecting one of the other third diffracted light beams;

detecting one of the other sixth diffraction light beams;

adjusting a relative displacement between said first and second objects in accordance with an intensity of the detected diffracted light beam; and adjusting the distance of the gap between said first and second objects in accordance with an intensity of the detected diffracted light beam.

10. The method according to claim 9, wherein the diffraction grating of the gap measurement mark is a two-dimensional diffraction grating which has cross-bars, one of cross-bars extending in the alignment direction.

11. The method according to claim 9, wherein the diffraction grating of the gap measurement mark is a one-dimensional grating which has parallel bars extending in the alignment direction.

12. The method according to claim 9, wherein said first object is a mask and said second object is a wafer.

13. The method according to claim 9, wherein the angle ($\alpha$) at which said first plane inclines to said second plane is 0°.

14. The method according to claim 9, wherein if the alignment direction is given as an x direction, an extending direction of the bars is given as a y direction, and a point on a line symmetrical to the optical axis of the incident light beam with respect to the first plane is given as an origin, the pitch in the y direction of said alignment mark is different from that of said gap measurement mark, and in the step of detecting the diffracted light beam, one of the $(0, \pm 1)$th orders of the other third diffracted light beam, and one of the $(0, \pm 1)$th orders of the other sixth diffracted light beam are separately picked up.

15. The method according to claim 9, wherein two marks are arranged on the first object, and two alignment marks and two gap measurement marks are arranged on said second object, pitches in the y direction of said two alignment marks are different from each other and pitches in the y direction of said two gap measurement marks are different from each other, the light beam emitted from said light source is simultaneously radiated onto said two marks, two light beams of the other third diffracted light beams which are diffracted by said two alignment marks and said two marks on said first object are separately picked up, two light beams of the other sixth diffracted light beams which are diffracted by said two gap measurement marks and said two marks on said first object are separately picked up, and a difference between intensities of the two light beams of the other third diffracted light beams is calculated and at the same time, a difference between intensities of the two light beams of the other sixth diffracted light beams is calculated, whereby the relative displacement between said first and second objects is adjusted in accordance with the difference between intensities of two light beams of the other third diffracted light beams, and at the same time, the distance of the gap between said first and second objects is adjusted in accordance with the difference between the intensities of two light beams of the other sixth diffracted light beams.

16. A method according to claim 9, wherein two marks are arranged on the first object, two alignment marks and two gap measurement marks are arranged on said second object, pitches in a y direction of said two alignment marks are equal to each other, and pitches in a y direction of said two gap measurement marks are equal to each other, the light beam emitted from said light source is alternately radiated onto said two marks for each predetermined period of time, two light beams of the other third diffracted light beams which are diffracted by said two alignment marks and said mark on said first object are alternately picked up for each predetermined period of time, two light beams of the other sixth diffracted light beams which are diffracted by said two gap measurement marks and said mark on said first object are alternately picked up for each predetermined period of time, and a difference between intensities of two light beams of the other third diffracted light beams is calculated, and at the same time, a difference between intensities of two light beams of the other sixth diffracted light beams is calculated, whereby the relative displacement between said first and second objects is adjusted in accordance with the difference between intensities of two light beams of the other third diffracted light beams, and at the same time, the distance of the gap between said first and second objects is adjusted in accordance with the difference between intensities of two light beams of the other sixth diffracted light beams.

17. An apparatus for aligning first and second objects, arranged to oppose each other, in a direction along their opposing surfaces, relative to each other, comprising:

a light source for emitting a light beam;

a first one-dimensional diffraction grating which is arranged on said first object, the first diffraction grating having parallel bars extending in a first direction perpendicular to the alignment direction, the first direction being perpendicular to a first plane, to which a second plane inclines at a predetermined angle ($\alpha$), said second plane being symmetrical to a third plane with respect to said first plane, the first diffraction grating receiving the light beam which has an optical axis present in the second plane, so that the light beam is diffracted and transmitted through the first diffraction grating, and first diffracted light beams are emerged from said first diffraction grating;

a second diffraction grating which is arranged on said second object, the second diffraction grating having a checkerboard pattern, the first diffracted light beams being transferred from the first diffraction grating to the second diffraction grating, so that the first diffracted light beams are diffracted and reflected by the second diffraction grating, second diffracted light beams are emerged from the second diffraction grating, and the second diffracted light beams are transferred from the second diffraction grating to the first diffraction grating, so that the second diffracted light beams are diffracted and transmitted through the first diffraction grating, and third diffracted light beams are emerged from said first diffraction grating, some of the third diffracted light beams are transferred in the third plane, and the other third diffracted light beams are transferred in any planes other than the third plane;

detecting means for detecting one of the other third diffracted light beams; and displacement adjusting means for adjusting a relative displacement between said first and second objects in accordance with an intensity of the detected diffracted light beam.

18. The apparatus according to claim 17, wherein said first object is a mask and said second object is a wafer.

19. The apparatus according to claim 17, wherein the angle ($\alpha$) at which said first plane inclines to said second plane is 0°.

20. The apparatus according to claim 17, wherein if the alignment direction is given as an x direction, the first direction is given as a y direction, and a point on a line symmetrical to the optical axis of the incident light beam with respect to the first plane is given as an origin,
said detecting means for detecting the diffracted light beam includes pickup means for picking up one of the $(0,\pm1)$th orders of the other third diffracted light beams.

21. The apparatus according to claim 18, wherein said detecting means for detecting the diffracted light beam includes a mirror for reflecting one of the other third diffracted light beams, and a photosensor for converting the diffracted light beam reflected by said mirror into a detection signal, and
said displacement adjusting means includes a signal processing circuit for processing the detection signal and producing a control signal, and wafer moving means for moving said wafer in accordance with the control signal, so as to adjust the relative displacement between said mask and said wafer.

22. The apparatus according to claim 17, wherein two sets of said first and second diffraction gratings are arranged on the first and second objects, respectively.

23. The apparatus according to claim 22, wherein if a distance between said two first diffraction gratings is given as u, a distance between said two second diffraction gratings is given as v, and a pitch in an x direction of said first and second diffraction gratings is given as px, and N is an arbitrary integer, u and v can be defined as:

$$u = v + \{(2N+1)/4\} \cdot px$$

said detecting means for detecting the diffracted light comprises pickup means for picking up one of the other third diffracted light beams diffracted by one set of said first and second diffraction gratings and one of the other third diffracted light beams diffracted by the other set of said first and second diffraction gratings, and
said displacement adjusting means includes calculation means for calculating a difference between intensities of the two diffracted light beams.

24. The apparatus according to claim 23, wherein grating pitches in the y direction of said two second diffracting gratings are different from each other, one of the other third diffracted light beams diffracted by one set of said first and second diffraction gratings, and the same order one of the other third diffracted light beams diffracted by the other set of said first and second diffraction gratings appear in different directions and
said detection means includes pickup means for separately picking up these diffracted light beams.

25. The apparatus according to claim 22, wherein said detecting means includes pickup means for picking up one of the other third diffracted light beams diffracted by one set of said first and second diffraction gratings, and one of the other third diffracted light beams diffracted by the other set of said first and second diffraction gratings, for each predetermined period of time, when light beam emitted from said light source is alternately radiated on said two sets of said first diffraction gratings for each predetermined period of time, and
said displacement adjusting means includes calculation means for calculating a difference between intensities of the two diffracted light beams.

26. The apparatus for aligning first and second objects, arranged to oppose each other, in a direction along their opposing surfaces, relative to each other, and at the same time, setting a gap between said first and second objects to a predetermined distance, comprising:
a light source for emitting a light beam;
a mark arranged on said first object, the mark having a one-dimensional diffraction grating which has parallel bars extending in a first direction perpendicular to the alignment direction, the first direction perpendicular to a first plane, to which a second plane inclines at a predetermined angle ($\alpha$), said second plane being symmetrical to a third plane with respect to said first plane, said mark receiving the light beam which has an optical axis present in the second plane, so that the light beam is diffracted and transmitted through said mark, and first and fourth diffracted light beams are emerged from said mark;
an alignment mark arranged on said second object, the alignment mark having a diffraction grating which has a checkerboard-like pattern, the first diffracted light beams being transferred from said mark to the alignment mark, so that the first diffracted light beams are diffracted and reflected by the alignment mark, second diffracted light beams are emerged from the alignment mark, and the second diffracted light beams are transferred from the alignment mark to said mark, so that the second diffracted light beams are diffracted and transmitted through said mark, third light diffracted beams are emerged from said mark, some of the third diffracted light beams are transferred in the third plane, and the other third diffracted light beams are transferred in any planes other than the third planes;
first detecting means for detecting one of the other third diffracted light beams;
a gap measurement mark arranged on said second object, the gap measurement mark having a diffraction grating which has at least one set of parallel bars extending in the alignment direction, the fourth diffracted light beams being transferred from said mark to the gap measurement mark, so that the fourth diffracted light beams are diffracted and reflected by the gap measurement mark, fifth diffracted light beams are emerged from the gap measurement mark, and the fifth diffracted light beams are transferred from the gap measurement mark to said mark, so that the fifth diffracted light beams are diffracted and transmitted through said mark, sixth light diffracted beams are emerged from said mark, some of the sixth diffracted light beams are transferred in the third plane, and the other third diffracted light beams are transferred in any planes other than the third planes;
second detecting means for detecting one of the other sixth diffracted light beams; and
displacement adjusting means for adjusting a relative displacement between said first and second objects in accordance with an intensity of the other third diffracted light beam being detected; and gap adjusting means for adjusting the distance of the gap between said first and second objects in accordance with an intensity of the other sixth diffracted light beam being detected.

27. The apparatus according to claim 26, wherein the diffraction grating of the gap measurement mark is a two-dimensional diffraction grating which has cross-bars, one of cross-bars extending in the alignment direction.

28. The apparatus according to claim 26, wherein the diffraction grating of the gap measurement mark is a one-dimensional grating which has parallel bars extending in the alignment direction.

29. The apparatus according to claim 26, wherein said first object is a mask and said second object is a wafer.

30. The apparatus according to claim 26, wherein the angle ($\alpha$) at which said first plane inclines to said second plane is 0°.

31. The apparatus according to claim 26, wherein if the alignment direction is given as an x direction, the first direction is given as a y direction, and a point on a line symmetrical to the incident light beam with respect to the first plane is given as an origin, a pitch in the y direction of said alignment mark is different from that of said gap measurement mark, and said first detecting means includes pickup means for picking up one of the $(0, -1)$th orders of the other third diffracted light beams, and said second detecting means includes pickup means for picking up one of the $(0, -1)$th orders of the other sixth diffracted light beams.

32. The apparatus according to claim 26, wherein two marks are arranged on the first object, two alignment marks and two gap measurement marks are arranged on the second object, pitches in the y direction of said two alignment marks are different from each other and pitches in the y direction of said two gap measurement marks are different from each other, the light beam emitted from said light source is alternately radiated onto said two marks for each predetermined period of time, said first detecting means includes pickup means for separately picking up two light beams of the other third diffracted light beams diffracted by said two alignment marks and said two marks of said first object, and said second detecting means includes a pickup means for separately picking up two light beams of the other sixth diffracted light beams diffracted by said two gap measurement marks and said two marks of said first object, said displacement adjusting means includes calculation means for calculating a difference between intensities of the two light beams of the other third diffracted light beams, and said gap adjusting means includes calculation means for calculating a difference between intensities of the two light beams of the other sixth diffracted light beams.

33. The apparatus according to claim 26, wherein said two masks are arranged on the first object, two alignment marks and two gap measurement marks are arranged on the second object, pitches in the y direction of said two alignment marks are equal to each other and pitches in the y direction of said gap measurement marks are equal to each other, said first detecting means includes pickup means for alternately picking up two light beams of the other third diffracted light beams diffracted by said two alignment marks and said two marks on said first object, for each predetermined period of time, and said second detecting means includes pickup means for alternately picking up two light beams of the other sixth diffracted light beams diffracted by said gap measurement marks and said two marks on said first object, for each predetermined period of time, when light is alternately radiated onto said marks on said first object for each predetermined period of time, and said displacement adjusting means includes calculation means for calculating a difference between intensities of the two light beams of the other third diffracted light beams, and said gap adjusting means comprises calculation means for calculating a difference between intensities of the two light beams of the other sixth diffracted light beams.

* * * * *